United States Patent
Fukuda et al.

(10) Patent No.: US 8,598,944 B2
(45) Date of Patent: Dec. 3, 2013

(54) SEMICONDUCTOR INTEGRATED CIRCUIT DECIDING A POWER-SUPPLY VOLTAGE BASED ON A DELAY TEST

(75) Inventors: Nariyuki Fukuda, Kanagawa-ken (JP); Noriyuki Moriyasu, Kanagawa-ken (JP); Isao Ooigawa, Kanagawa-ken (JP); Toshiyuki Furusawa, Tokyo (JP); Satoko Kawakami, Kanagawa-ken (JP); Hitoshi Nemoto, Kanagawa-ken (JP); Hiroyuki Fujioka, Kanagawa-ken (JP); Eiji Sawada, Kanagawa-ken (JP); Tokio Tanaka, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/556,364

(22) Filed: Jul. 24, 2012

(65) Prior Publication Data
US 2013/0207692 A1 Aug. 15, 2013

(30) Foreign Application Priority Data
Feb. 10, 2012 (JP) .................................. 2012-026799

(51) Int. Cl.
*G11C 5/14* (2006.01)
(52) U.S. Cl.
USPC ............................ 327/530; 327/538; 327/544
(58) Field of Classification Search
USPC ......... 327/530, 538, 540, 541, 543, 544, 545, 327/546; 713/320, 340
See application file for complete search history.

(56) References Cited

U.S. PATENT DOCUMENTS

| 8,154,335 | B2* | 4/2012 | Chawla et al. | 327/544 |
|---|---|---|---|---|
| 8,269,545 | B2* | 9/2012 | Chawla et al. | 327/262 |
| 2010/0019834 | A1* | 1/2010 | Zerbe et al. | 327/538 |
| 2010/0289553 | A1* | 11/2010 | Wang | 327/512 |
| 2011/0163801 | A1* | 7/2011 | Chua-Eoan | 327/544 |
| 2011/0175658 | A1* | 7/2011 | Nomura | 327/261 |

FOREIGN PATENT DOCUMENTS

| JP | 2005-051534 | 2/2005 |
|---|---|---|
| JP | 2008-305925 | 12/2008 |

* cited by examiner

*Primary Examiner* — Lincoln Donovan
*Assistant Examiner* — Jung H. Kim
(74) *Attorney, Agent, or Firm* — White & Case LLP

(57) ABSTRACT

According to one embodiment, a semiconductor integrated circuit includes a semiconductor integrated circuit a voltage regulator providing a prescribed power-supply voltage, a plurality of delay test circuits, each of the delay test circuits being configured in each of areas where electrical current flows in response to each of operation modes, a test control unit executing a delay test using the delay test circuit under a test mode while decreasing a power-supply voltage in a stepwise fashion, a supply voltage decision unit deciding the power-supply voltage of the operation mode on a basis of the delay test, a memory unit storing the power-supply voltage of each operation mode, a supply voltage configuration unit reading out the power-supply voltage corresponding to the operation mode from the memory unit, and the supply configuration unit arranging the power-supply voltage as an output voltage of the voltage regulator when each of the operation modes starts to execute.

12 Claims, 11 Drawing Sheets

SEMICONDUCTOR INTEGRATED CIRCUIT DECIDING A POWER-SUPPLY VOLTAGE BASED ON A DELAY TEST

CROSS REFERENCE TO RELATED APPLICATION

This application is based upon and claims the benefit of priority from prior Japanese Patent Application No. 2012-026799, filed on Feb. 10, 2012, the entire contents of which are incorporated herein by reference.

FIELD

Exemplary embodiments described herein generally relate to a semiconductor integrated circuit.

BACKGROUND

Recently, lower power consumption in a large scale integrated circuit (LSI) has been demanded. Especially, an LSI for a personal digital assistance (PDA), for example, has been set strict specifications. Therefore, lower power consumption has been studied as an important problem to be solved in LSI development.

Lowering power-supply voltage in LSI is significantly effective as a solution. On the other hand, an operation speed of a transistor is decreased when the power-supply voltage is lowered. As a result, a delay period for signal transmittance between circuits is increased. The signal transmittance of a critical pass which has the least allowance to signal delay may be decreased below a low limitation.

In such a situation, a method for setting a replica circuit which duplicates electrical characteristics of the critical pass, has conventionally proposed. In such a manner, the power-supply voltage of LSI is controlled corresponding to a judgment on characteristics of the replica circuit.

However, LSI in which variety kinds of functional blocks are mounted, has different kinds of combinations between functional blocks dependent on an operation mode. As a result, an amount of electrical current is different between one area and another area, for example, in one chip, where one area includes a function block which is just operating and another area includes a function block which is just stopping the operation.

Accordingly, a case is arisen where junction temperature of the transistor is different in the one chip. In an area where the junction temperature is increased, speed of the transistor is lowered.

Furthermore, lowering of the power-supply voltage is also generated due to a wiring resistance of a power-supply line in the area where the junction current is increased.

In other word, non-uniformity of the operation speed of the transistor is caused by a different operation mode.

Therefore, the conventional replica circuit may not necessarily duplicate the electrical characteristics of the critical pass due to a position of the replica circuit.

The situation mentioned above cause a problem that the power-supply voltage of the LSI may be not suitably set.

DETAILED DESCRIPTION

Figure 1:
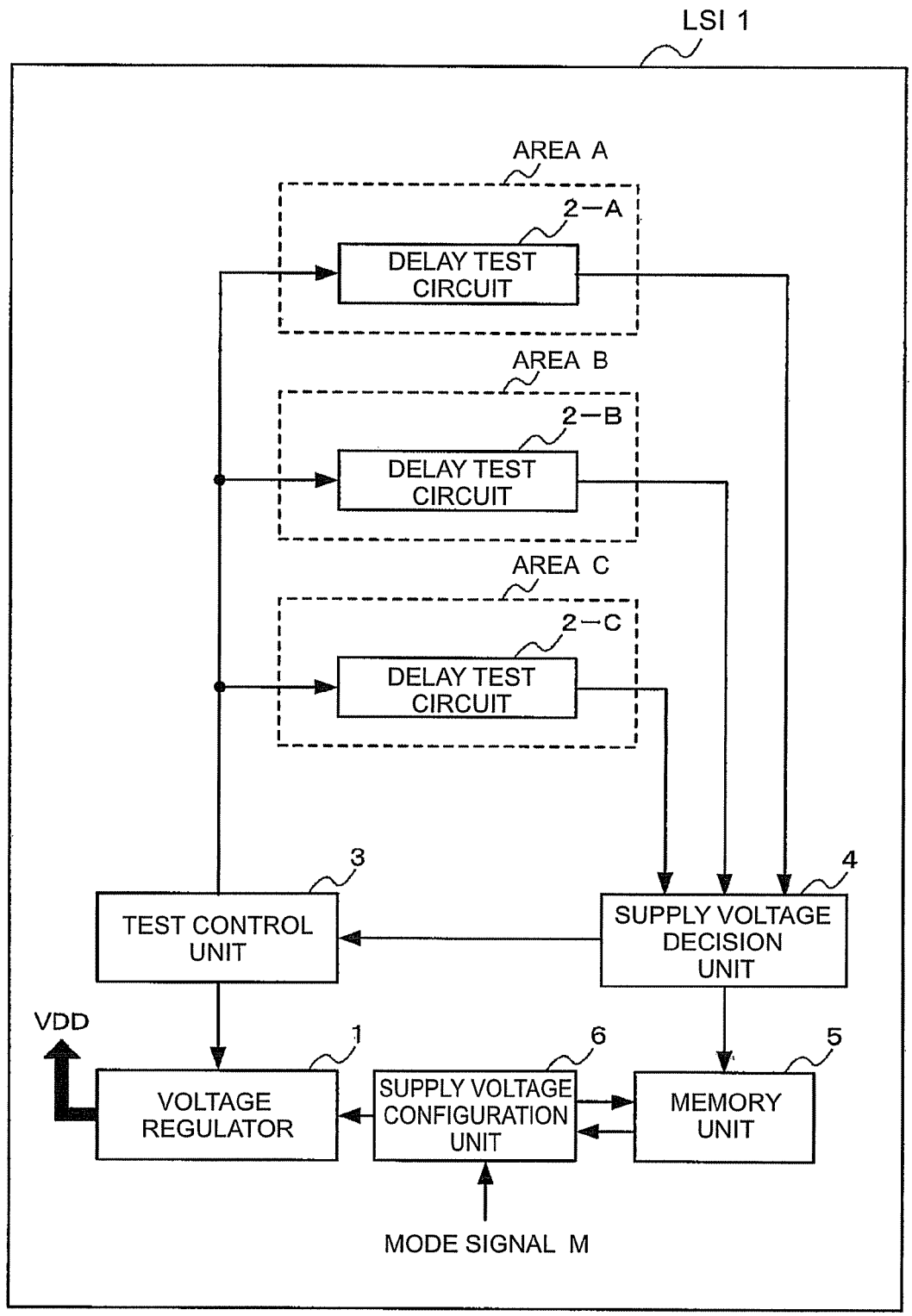
FIG. 1 is a block diagram showing a constitution of a semiconductor integrated circuit according to a first embodiment.

According to one embodiment, a semiconductor integrated circuit includes a semiconductor integrated circuit a voltage regulator providing a prescribed power-supply voltage, a plurality of delay test circuits, each of the delay test circuits being configured in each of areas where electrical current flows in response to each of operation modes, a test control unit executing a delay test using the delay test circuit under a test mode while decreasing the power-supply voltage in a step-wise fashion, a supply voltage decision unit deciding a power-supply voltage of the operation mode on a basis of the delay test, a memory unit storing the power-supply voltage of each operation mode, a supply voltage configuration unit reading out the power-supply voltage corresponding to the operation mode from the memory unit, and the supply configuration unit arranging the power-supply voltage as an output voltage of the voltage regulator when each of the operation modes starts to execute.

Embodiments will be described below in detail with reference to the drawings. Throughout the attached drawings, similar or same reference numerals show similar, equivalent or same components. Accordingly, the description is not repeated.

(First Embodiment)

FIG. 1 is a block diagram showing a constitution of a semiconductor integrated circuit according to a first embodiment.

A semiconductor integrated circuit LSI1 is formed in a semiconductor chip, and includes a voltage regulator 1, delay test circuits 2-A, 2-*b*, 2-C, a test control unit 3, a supply voltage decision unit 4, a memory unit 5, a supply voltage configuration unit 6 and a plurality of areas A, B, C.

The voltage regulator 1 provides a power-supply voltage VDD preliminarily designed. An amount of operation current flowed in each of the areas changes in response to each of operation modes. Accordingly, larger amount of operation current in each of the areas is different dependent on each of the operation modes. The delay test circuits 2-A, 2-B, 2-C are arranged in each of the areas, respectively. The test control unit 3 controls to execute a delay test using the delay test circuits 2-A, 2-B, 2-C in a test mode while decreasing the power-supply voltage VDD. A supply voltage decision unit 4 decides a power supply voltage of the operation mode on a basis of a result of the delay test. A memory unit 5 stores a value of the power supply voltage of the operation mode. A supply voltage configuration unit 6 reads out the value of the power supply voltage of the operation mode and sets power supply voltage as an output voltage of the voltage regulator 1 when starting to execute the operation mode.

The voltage regulator 1 shifts the power-supply voltage VDD supplied into the chip due to control by the test control unit in the test mode and due to configuration by the supply voltage configuration unit 6 in the operation mode.

Here, the semiconductor integrated circuit LSI1 according to the first embodiment is operated in three operation modes, an operation mode A, operation mode B and operation mode C. Further, when the operation mode is different, the area to be operated in the chip is changed so that the area in which larger operation current flows in the chip is different in every operation mode. When larger operation current flows, a delay period of the circuit arranged in the area is increased due to increasing of temperature and lowering of the power-supply voltage in the circuit.

Therefore, the semiconductor integrated circuit LSI1 according to the first embodiment is divided into the areas A, B, C corresponding to a distribution of the operation current to be flowed at each operation mode.

The delay test circuit 2 is arranged in each area to monitor the delay period of the area in the semiconductor integrated circuit LSI1 according to the first embodiment. In other words, the delay test circuits 2-A, 2-B, 2-C are arranged in the areas A, B, C, respectively.

The test control unit 3 executes a delay test using the delay test circuits 2-A, 2-B, 2-C under the test mode. In such a manner, the test control unit 3 controls voltage regulator 1, and transmits test data for the delay test to the delay test circuits 2-A, 2-B, 2-C while decreasing the power supply voltage VDD in stepwise.

The supply voltage decision unit 4 decides the power supply voltage of the operation mode on the basis of the result of the delay test. When deciding, the supply voltage decision unit 4 sets the lowest power supply voltage as the power supply voltage of each operation mode where all the delay periods of the delay test circuits 2-A, 2-B, 2-C are set within a prescribed specification range.

The value of the power supply voltage of the operation mode decided by the supply voltage decision unit 4 is written in the memory unit 5 and the values of the power supply voltages are stored in the memory unit 5.

A supply voltage configuration unit 6 receives an input of a mode signal M. Further, the voltage configuration unit 6 reads out the power supply voltage indicated by mode signal M from the memory unit 5 and sets the power supply voltage as an output voltage of the voltage regulator 1 when starting to execute each operation mode. In such a manner, the power-supply voltage VDD, which is the output voltage of the voltage regulator 1, is set as the lowest voltage in a range in which each of the operation modes is normally acted.

Figure 2:
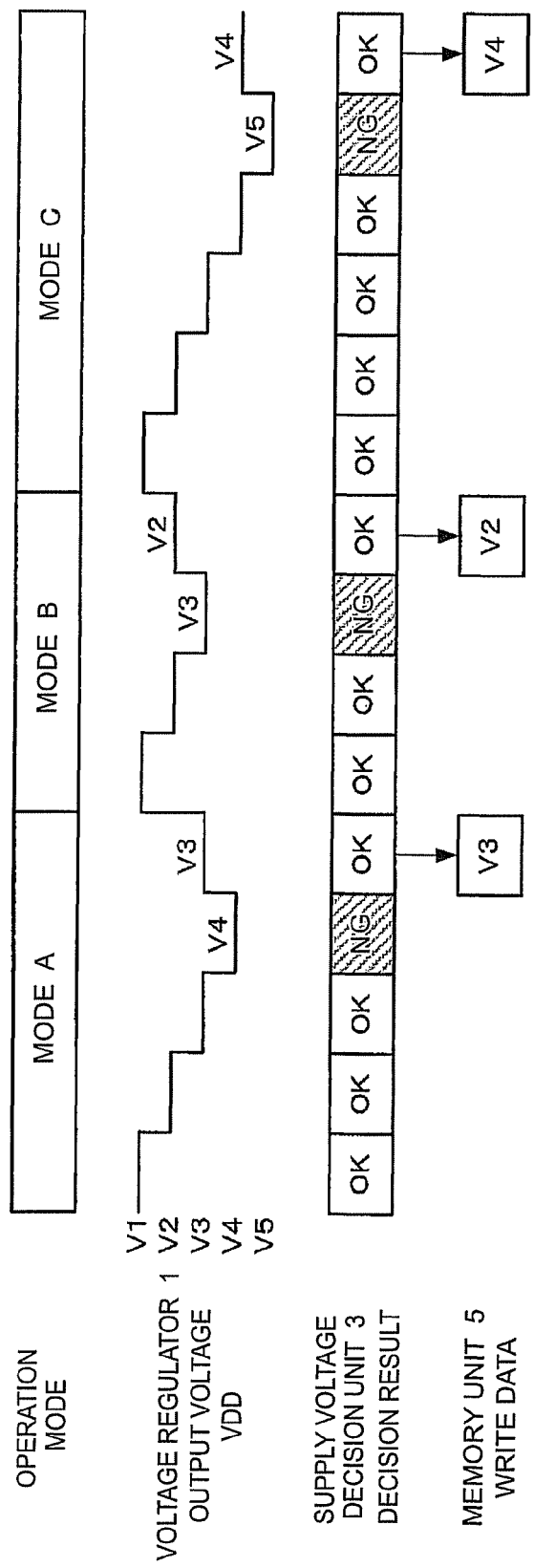
FIG. 2 is an operation diagram showing an operation of the semiconductor integrated circuit according to the first embodiment.

FIG. 2 shows an operation of the semiconductor integrated circuit LSI1 according to the first embodiment when the delay test mentioned above is executed.

The test control unit 3 controls the output voltage of the voltage regulator 1 in each of the operation modes and transmits the test data for the delay test to the delay test circuits 2-A, 2-B, 2-C in each voltage while decreasing the power-supply-voltage VDD to V1, V2, V3, V4, V5 in stepwise.

When transmitting the test data, the supply-voltage decision unit 4 checks whether or not all of the delay periods of the delay test circuits 2-A, 2-B, 2-C are set in prescribed range. The supply-voltage decision unit 4 decides "OK" when the delay period is in the range, however, the supply-voltage decision unit 4 decides "NO" when the delay period is out of the range. The decision result is transmitted to the test control unit.

The test control unit stops to decrease the power-supply voltage VDD to return back one step when the decision result is "NG". Namely, the voltage V4 is "NG" to be returned to the voltage V3 in the mode A. Similarly, the voltage V3 is "NG" to be returned to the voltage V2 in the mode B, and the voltage V5 is "NG" to be returned to the voltage V4 in the mode C.

The supply-voltage decision unit 4 decides the returned voltage as the power-supply voltage in each of the operation modes to write into the memory unit 5. In other words, the voltages V3, V2, V4 are written into the memory unit 5 as the power-supply voltage in the modes A, B, C, respectively.

Figure 3:
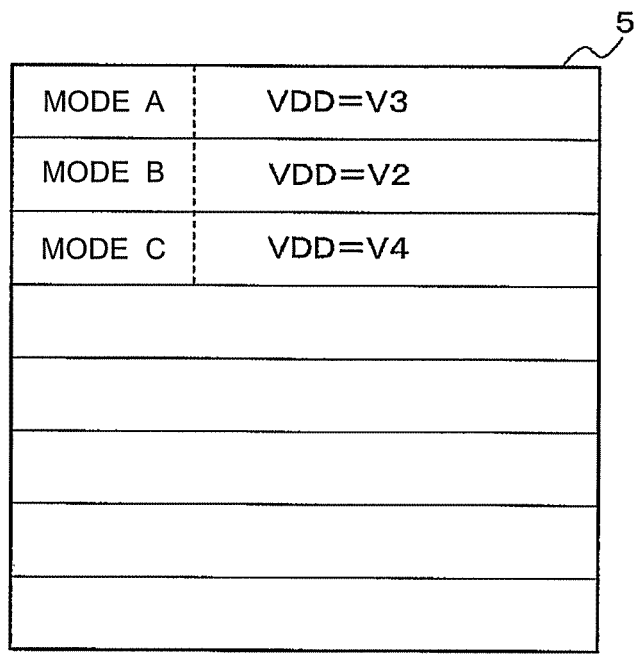
FIG. 3 is a conceptual diagram of a memory unit showing memorized power-supply voltage values in the semiconductor integrated circuit according to the first embodiment.

FIG. 3 shows power-supply voltage values stored in the memory unit.

In such an example, an operation mode class and a power-supply voltage value of each address are written in the memory unit.

Figure 4:
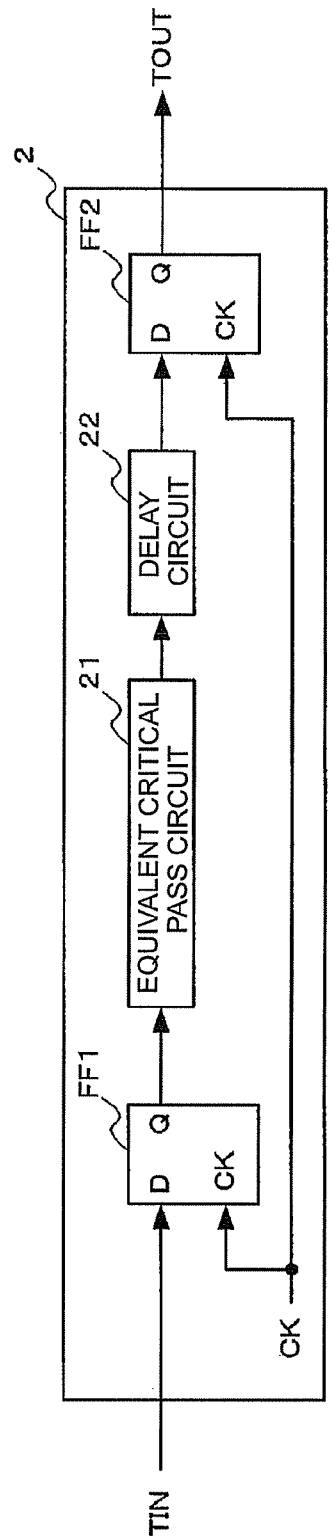
FIG. 4 is a block diagram showing an inner constitution of a delay test circuit of the semiconductor integrated circuit according to the first embodiment.

FIG. 4 shows an inner constitution of a delay test circuit 2.

In such an example, an equivalent critical pass circuit 21 and delay circuit 22 are connected between two flip-frops FF1, FF2. The equivalent critical pass circuit 21 includes delay characteristics corresponding to a critical pass in the circuit and the delay circuit 22 adds a delay period range, which can be allowable on non-uniformity of the delay characteristics in the semiconductor chip, to the equivalent critical pass circuit 21.

The equivalent critical pass circuit 21 includes the same circuit as the critical pass which has the least allowance to the signal delay in the circuit, for example, and has the delay characteristics corresponding to the critical pass.

Accordingly, an output of the equivalent critical pass circuit 21 to a shift of an input signal may have the same delay characteristics as that of the critical pass. However, it is not limited that the output delay period of the equivalent critical pass circuit 21 is equal to the critical pass due to non-uniformity of the transistor characteristics in the semiconductor chip when a layout of the equivalent critical pass circuit 21 is actually varied.

In such a manner, the delay circuit 22 in this embodiment is connected to the output of the equivalent critical pass circuit 21 in consideration with the case mentioned above.

Figure 5:
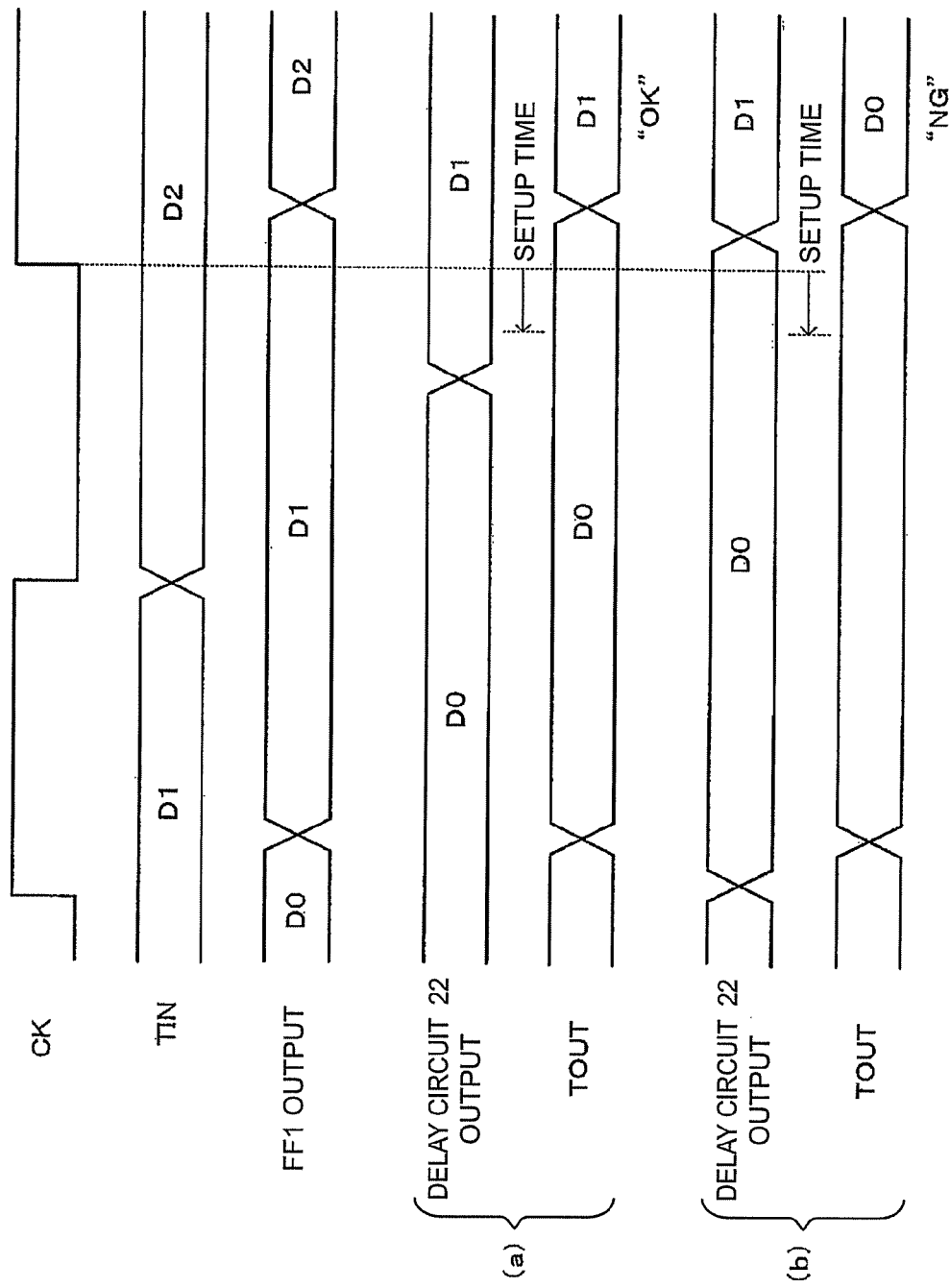
FIG. 5 is a wave diagram showing a delay test using the delay test circuit as shown in FIG. 4 in the semiconductor integrated circuit according to the first embodiment.

FIG. 5 shows an aspect of the operation mode in the delay test using the delay test circuit 2 as shown in FIG. 4.

Data 1 are correctly outputted to an output TOUT of the flip-flop FF2 as shown at (a) when test data are inputted into an input TIN in a case that an output of the delay circuit 22 satisfies a specification of a set-up period of the flip-flop FF2.

On the other hand, the output TOUT of the flip-flop FF2 is different from data 1 as shown at (b) in a case that the output TOUT of the delay circuit 22 infringes the specification of the set-up period of the flip-flop FF2.

In the above case, the supply voltage decision unit 4 decides "OK" or "NG" mentioned above based on whether or not the data are correctly transmitted to the output TOUT of the flip-flop FF2.

The power-supply voltage of the operation mode can be decided based on the result of the delay test according to the first embodiment. In the delay test, the semiconductor chip is divided into the plurality of the areas corresponding to a distribution of the operation current. Furthermore, each delay test circuit 2 is located in each of the area in which a larger amount of operation current corresponding to each of the operation modes. In the test mode, the delay test is executed using the delay test circuit 2 while decreasing the power-supply voltage VDD in stepwise. In such a manner, when the delay characteristics is shifted in the semiconductor chip due to a switch of the operation mode, the power-supply voltage VDD corresponding to the shift of the delay characteristics can be controlled in lower-voltage trend.

The power-supply voltage decided in each operation mode is stored in the memory unit 5. The power-supply voltage is read out from the memory unit 5. Successively, the power-supply voltage VDD outputted from the voltage regulator 1 can be set to the lowest voltage which is necessary to operate correctly each operation mode.

(Second Embodiment)

Figure 6:
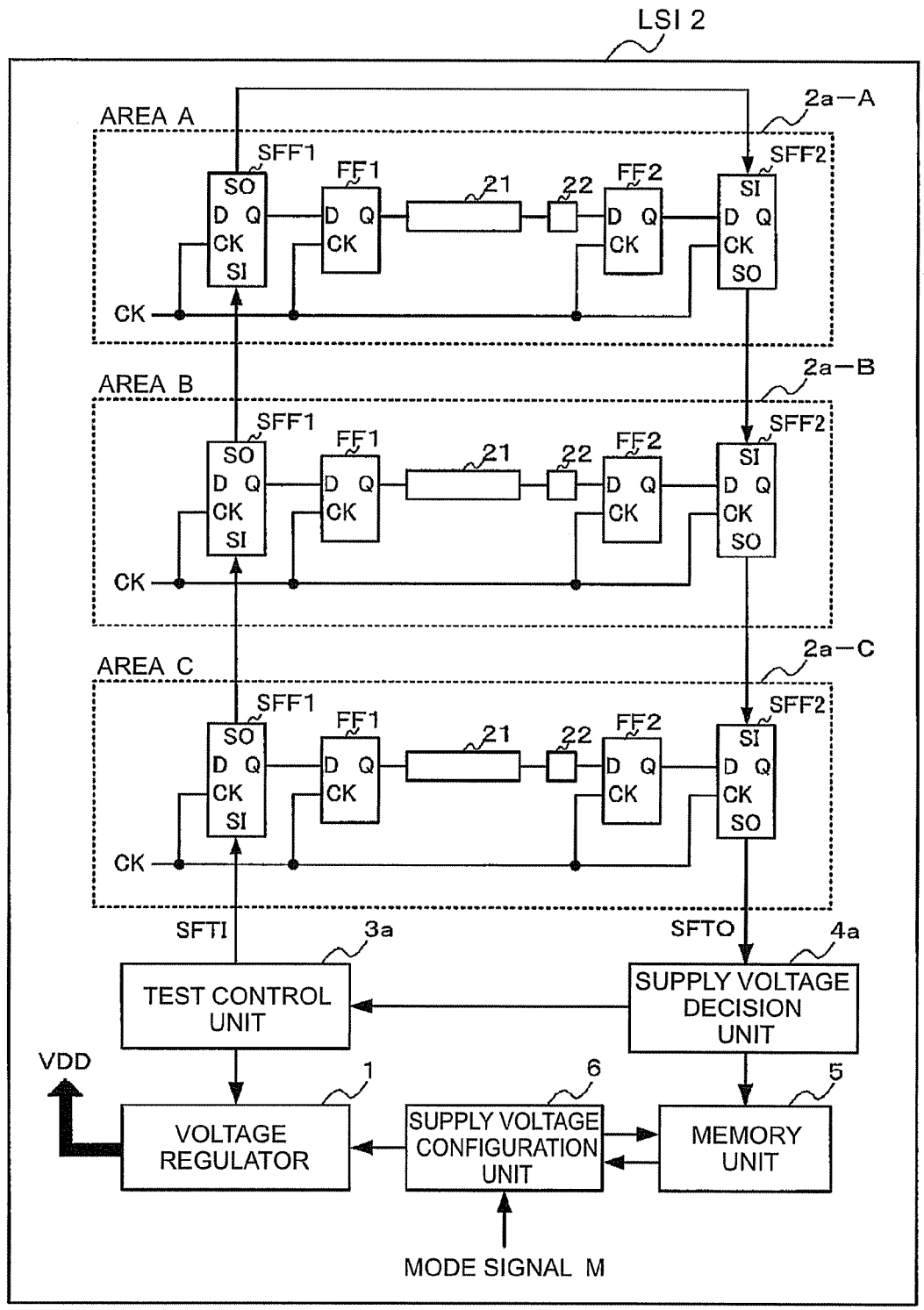
FIG. 6 is a block diagram showing a constitution of a semiconductor integrated circuit according to a second embodiment.

FIG. 6 is a block diagram showing a constitution of a semiconductor integrated circuit according to a second embodiment.

A semiconductor integrated circuit LSI2 according to the second embodiment is different from the semiconductor integrated circuit LSI1 according to the first embodiment under a point mentioned below. Each of delay test circuits 2a-A, 2a-B, 2a-C includes scan flip-flops SFF1, SFF2 at an input side and an output side, respectively. The scan flip-flops SFF1, SFF2 of each of the delay test circuits are serially connected, respectively, to constitute each scan pass.

In the semiconductor integrated circuit LSI 2 according to the second embodiment, a test control circuit 3a inputs test data for delay period test SFTI to the delay test circuits 2a-A, 2a-B, 2a-C through the scan pass mentioned above by scan-shift.

Further, a supply voltage 4a is received an output of the delay test circuits 2a-A, 2a-B, 2a-C through the scan pass mentioned above as scan shift output data SFTO.

In such an example as shown in FIG. 6, a flip-flop FF1, an equivalent critical pass circuit 21, a delay circuit 22, and a flip-flop FF2 are connected between the scan flip-flops SFF1, SFF2 in the delay test circuit 2a.

Figure 7:
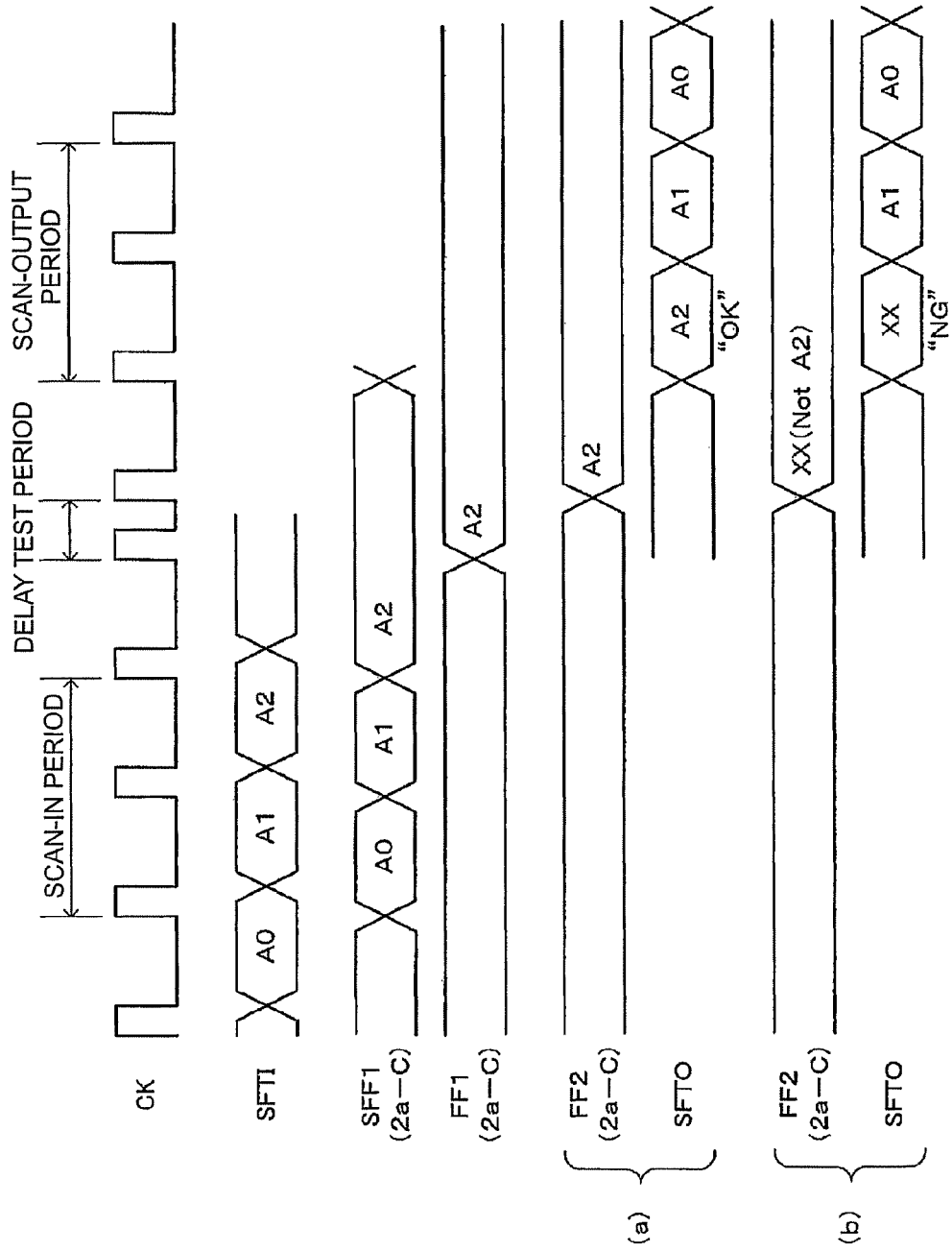
FIG. 7 is a wave diagram showing a delay test using a delay test circuit in the semiconductor integrated circuit according to the second embodiment.

FIG. 7 shows an operation wave form of a delay test circuit 2a-C, for example of the delay test circuit 2a, according to the second embodiment.

Data A0, A1, A2 as the test data for delay period test SFTI are inputted into the delay test circuits 2a-A, 2a-B, 2a-C in a scan-in period. In this case, a frequency of clock CK is set to be lower frequency than a frequency in a normal operation for executing shift operation reliably.

The data A2 is set in the scan flip-flop SFF1 of the delay test circuit 2a-C after finishing the scan-in period.

Next, the scan mode is exchanged to a system operation mode, and the delay test is executed. In the delay test period, two clocks of normal frequency are inputted.

In the steps, the data A2 are transferred from the scan flip-flop SFF1 to flip-flop FF1 by the first clock and are transferred from the flip-flop FF1 to flop FF2 by the second clock.

The output of the flip-flop FF2 is set to be A2 as shown at (a) when a specification of a set-up period of the flip-flop FF2 is satisfied. On the other hand, the output of the flip-flop FF2 is set to be a value XX other than A2 as shown at (b) when the specification of the set-up period of the flip-flop FF2 is not satisfied.

After that, the system operation mode is exchanged into the scan operation mode, and the CK shifts to scan-out period. The output of the flip-flop FF2 is transferred into the scan flip-flop SFF2. The data transferred into the scan flip-flop SFF2, are outputted to the supply voltage decision unit 4a as the scan shift output data SFTO.

A supply voltage decision unit 4a decides whether or not the output of each delay test circuit is correct based on the scan shift output data SFTO.

Providing one scan pass as one wiring enable that the test data for delay period test SFTI can be transmitted to the delay test circuits 2a-A, 2a-B, 2a-C and the output data can be transferred from the delay test circuits 2a-A, 2a-B, 2a-C according to the second embodiment. In such a manner, the semiconductor chip with less wiring number can be realized to improve easily a layout in a semiconductor chip.

(Third Embodiment)

A delay test is executed in a state where each semiconductor integrated circuit is mounted in an electronic equipment to be used and a power-supply voltage in each operation mode is decided according to the first and second embodiments. Accordingly, power consumption is generated in the electronic equipment by execution. On the other hand, lower power consumption has been desired in electronic equipment as a personal digital assistance.

Therefore, a semiconductor integrated circuit, which can set a power-supply voltage, without the delay test in the electronic equipment is demonstrated according to a third embodiment, for example.

Figure 8:
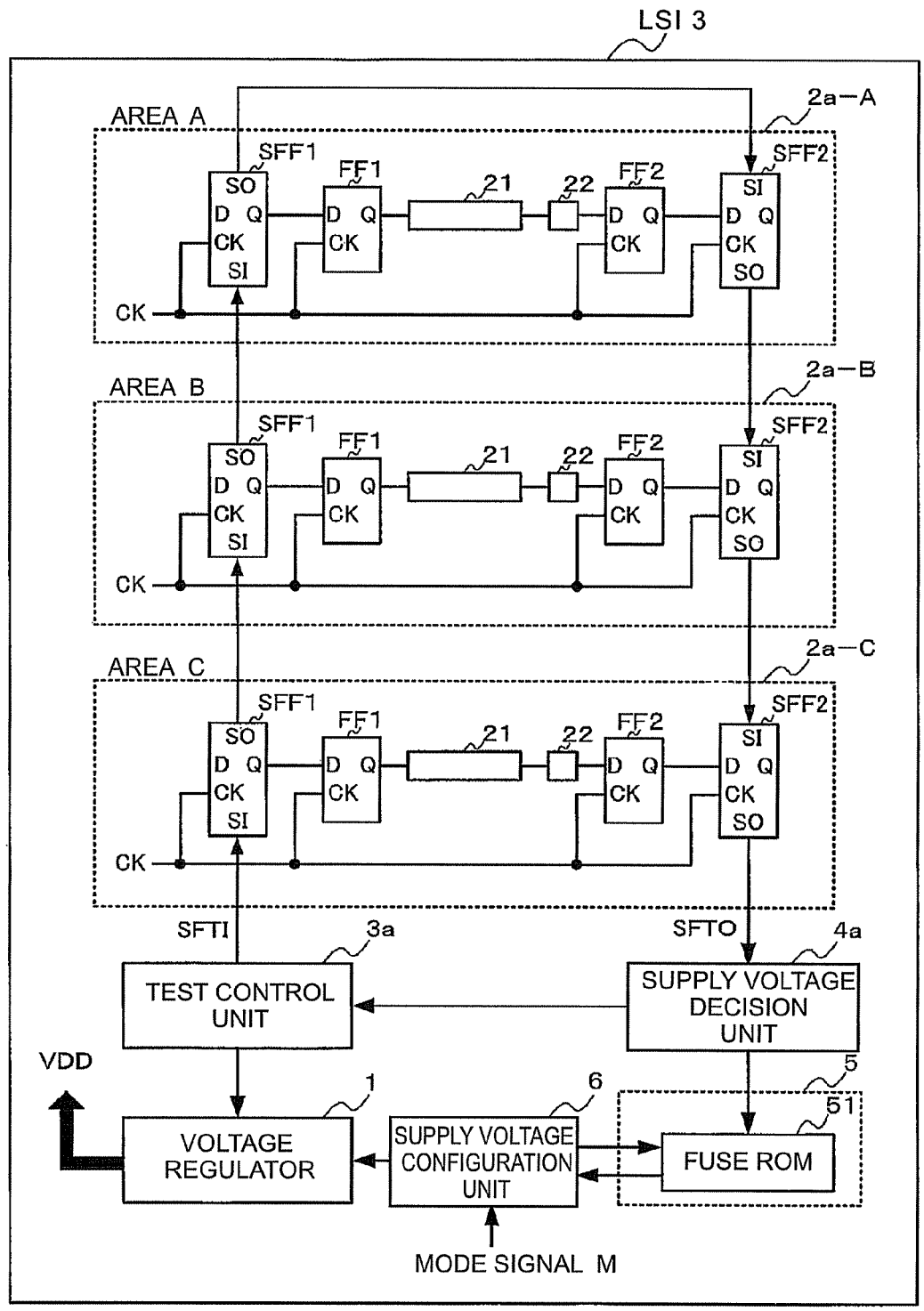
FIG. 8 is a block diagram showing a constitution of a semiconductor integrated circuit according to a third embodiment.

FIG. 8 is a block diagram showing a constitution of a semiconductor integrated circuit according to the third embodiment;

A semiconductor integrated circuit LSI3 according to the third embodiment is different from the semiconductor integrated circuit LSI2 according to the second embodiment under a point mentioned below. A memory unit 5 includes a fuse ROM 51 in the third embodiment.

The fuse ROM 51 can be programmed by electrical or laser cutting methods.

The delay test mentioned in the second embodiment is executed a product test in processing steps of the semiconductor integrated circuit LSI3 in the third embodiment. Further, a value of a power-supply voltage is written in the fuse ROM 51.

Accordingly, the semiconductor integrated circuit LSI3 in the third embodiment includes the value of the power-supply voltage in the operation mode stored in the fuse ROM 51 in a shipment step. As a result, the power-supply voltage in each operation mode can be set by reading out from the fuse ROM 51 after shipment.

The value of the power-supply voltage in each operation mode can be set without the delay test of the semiconductor integrated circuit according to the third embodiment. As a result, power consumption after mounting on the electronic equipment can be decreased.

(Fourth Embodiment)

Figure 9:
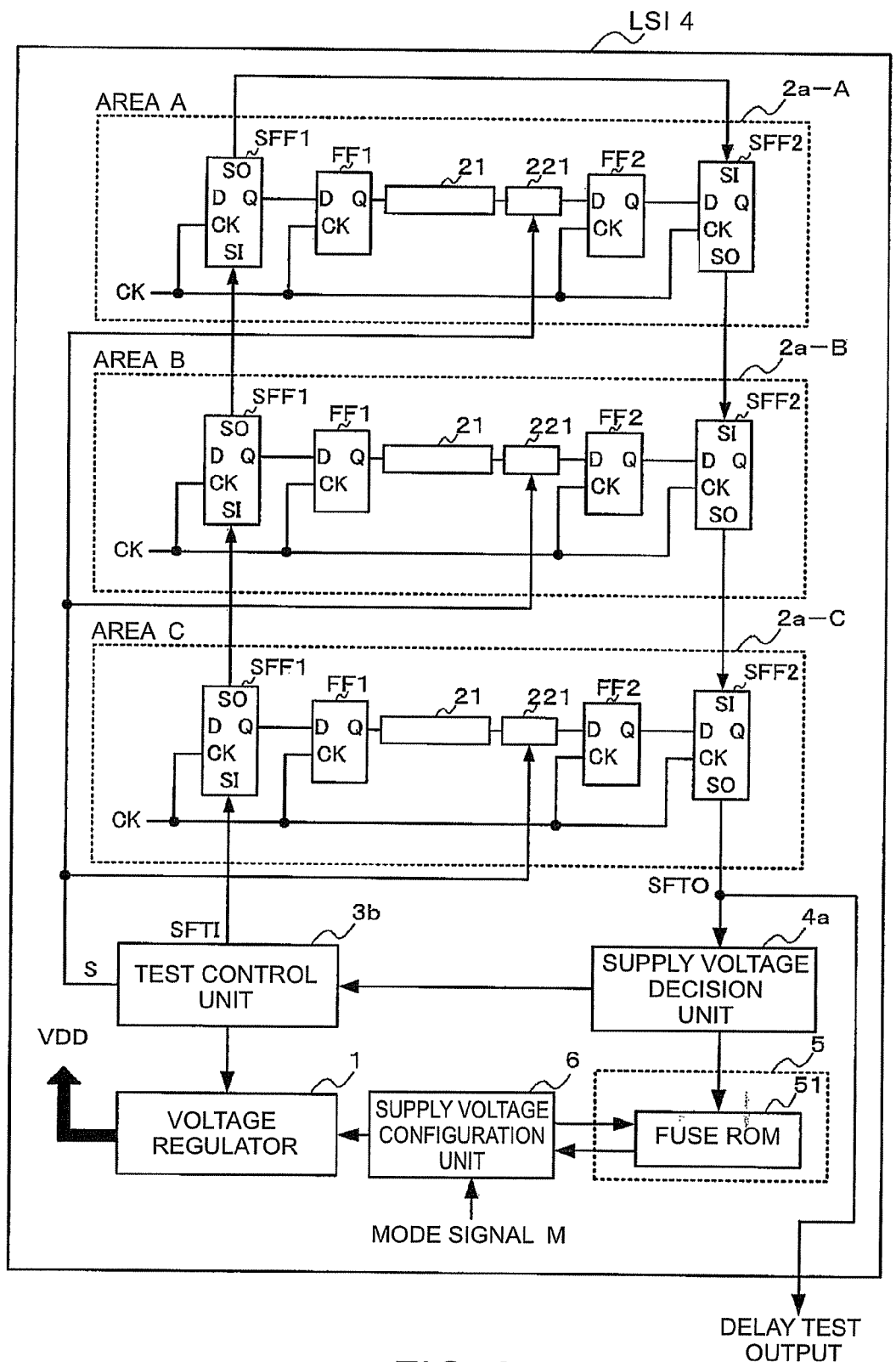
FIG. 9 is a block diagram showing a constitution of a semiconductor integrated circuit according to a fourth embodiment.

FIG. 9 is a block diagram showing a constitution of a semiconductor integrated circuit according to a fourth embodiment.

A semiconductor integrated circuit LSI4 according to a fourth embodiment is different from the semiconductor integrated circuit LSI3 according to the third embodiment under a point mentioned below. A delay circuit 22 in a delay test circuit 2a is replaced to a variable delay circuit 221 which can shift a delay period in stepwise. A scan shift output data SFTO are configured to output to delay test output terminal as an outer terminal by using the variable delay circuit 221.

Figure 10:
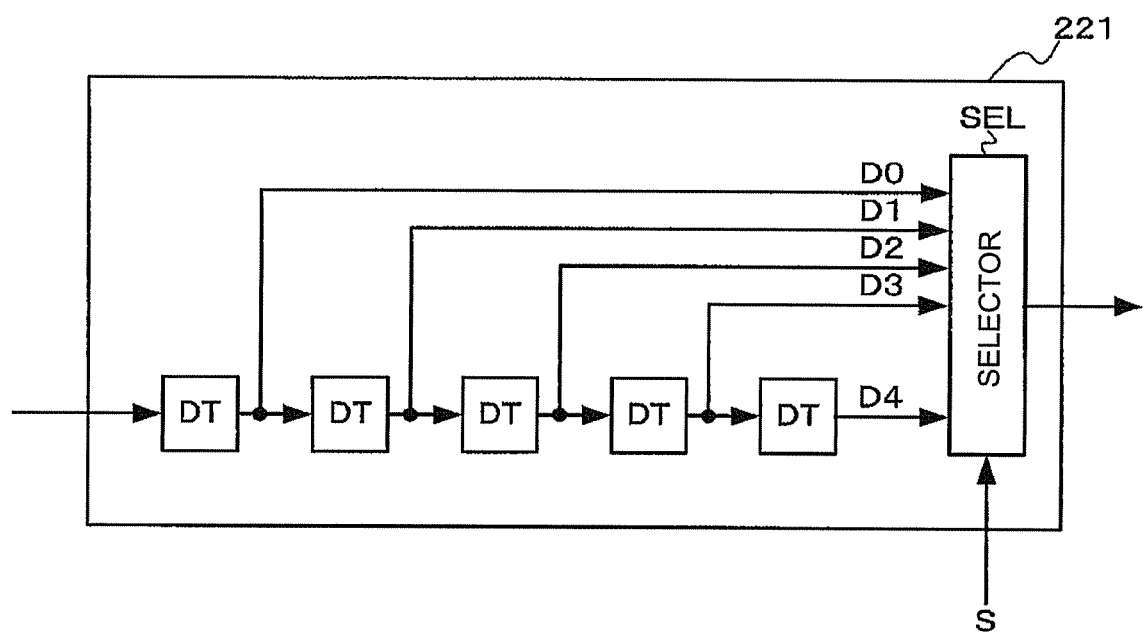
FIG. 10 is a block diagram showing an inner constitution of a variable delay circuit of the semiconductor integrated circuit according to the fourth embodiment.

FIG. 10 shows constitution of a variable delay circuit 221, for example. Here, the delay period can be exchanged in five steps, for example, in the variable delay circuit 221. However, a number of exchanging steps on the delay period can be arbitrarily designed.

The variable delay circuit 221 as shown in FIG. 10 includes five unit delay circuits serially connected each other and a selector SEL which selects one of outputs D0-D4 of each unit delay circuit DT by selection signal S.

The selection signal S is outputted from a test control unit 3. The output D0 is selected when the power-supply voltage of each operation mode is set by executing the delay test mentioned above.

A margin can be indirectly checked to a set-up period of a critical pass by using the variable delay circuit 221 in the semiconductor integrated circuit LSI4 according to the fourth embodiment.

Figure 11:
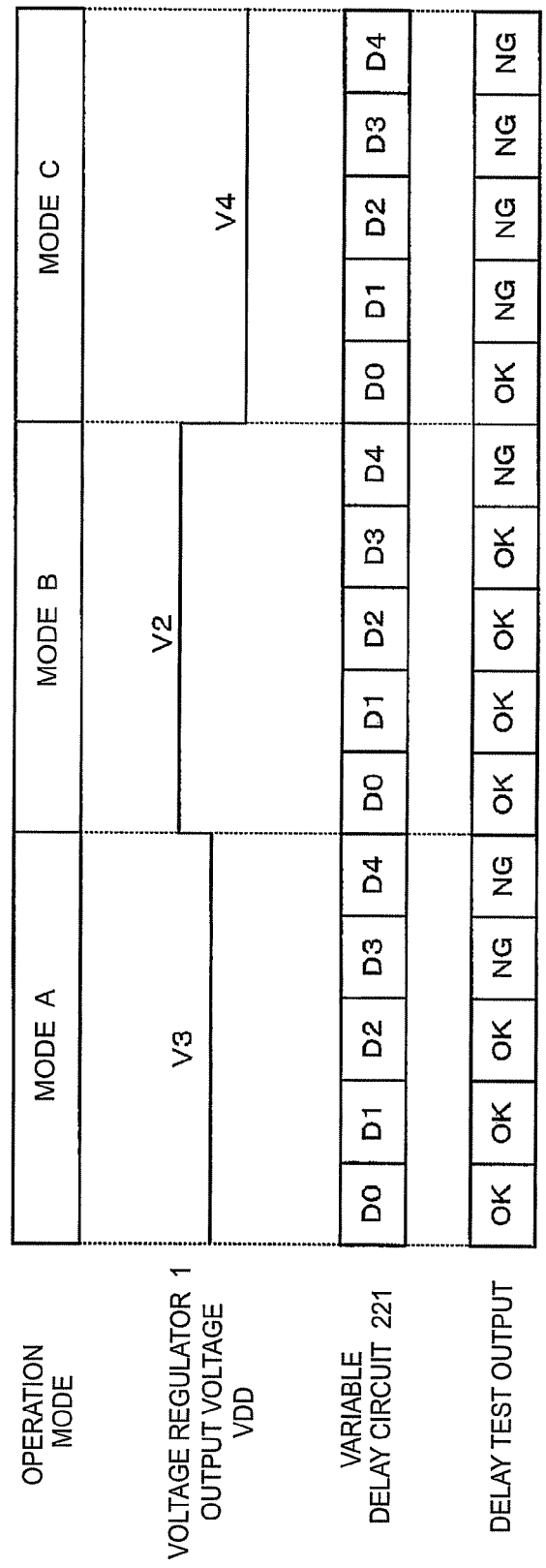
FIG. 11 is an operation diagram showing a delay test of the semiconductor integrated circuit according to the fourth embodiment.

FIG. 11 shows an operation which checks the margin.

After obtaining the lowest operation voltage in each operation mode by executing the delay test as shown in .FIG. 2, for example, the delay test for checking the margin is executed.

The power-supply voltage VDD is set to be V3 in the mode A, V2 in the mode B, and V4 in the mode C, respectively. Further, the delay tests are repeatedly executed while the output of the variable delay circuit 221 is shifted from D0 to D4 in order.

In this case, the supply voltage decision unit 4a observes the scan shift output data SFTO outputted to the delay output terminal so as to judge whether the scan shift output data SFTO is correct "OK" or not "NG". A range, in which the judge is "OK", is a margin of the equivalent critical pass circuit which is equal to the critical pass.

A delay test as shown in FIG. 11 reveals the margin is set to be from D0 to D2 in an operation mode A and from D0 to D3 in an operation mode B.

However, the margin is "NG" in D2 of an operation mode C. As a result, the operation mode C scarcely has a margin. In a case where the margin is lack, the operation may be unstably. In such the case, it can be decided the power-supply voltage can be further increased by one step.

The delay period in the delay test circuit 2a can be shifted in stepwise by using the variable delay circuit 221. Accordingly, the margin of a set-up period on the critical pass can be checked.

The power-supply voltage VDD corresponding to the shift of the delay characteristics in the semiconductor chip due to a shift of the operation mode can be controlled in lower-voltage trend according to at least one semiconductor integrated circuit selected from the first embodiment to fourth embodiment mentioned above.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor integrated circuit, comprising:
a voltage regulator providing a prescribed power-supply voltage;
a plurality of delay test circuits, each of the delay test circuits being configured in each of areas where electrical current flows in response to each of operation modes;
a test control unit executing a delay test using the delay test circuit under a test mode while decreasing the power-supply voltage in a stepwise fashion;
a supply voltage decision unit deciding the power-supply voltage of the operation mode on a basis of the delay test;
a memory unit storing the power-supply voltage of each operation mode;
a supply voltage configuration unit reading out the power-supply voltage corresponding to the operation mode from the memory unit, and the supply configuration unit arranging the power-supply voltage as an output voltage of the voltage regulator when each of the operation modes starts to execute.

2. The semiconductor integrated circuit of claim 1, wherein the power-supply voltage decision unit decides the lowest power-supply voltage as the power-supply voltage where all delay periods of the delay test circuits are set within a prescribed specification range.

3. The semiconductor integrated circuit of claim 2, wherein the delay test circuit includes an equivalent critical pass circuit having delay characteristics corresponding to a critical pass.

4. The semiconductor integrated circuit of claim 3, wherein the delay test circuit includes a delay circuit which adds a range of the delay period including non-uniformity of the delay characteristics to the equivalent critical pass circuit.

5. The semiconductor integrated circuit of claim 4, wherein each of the delay test circuits includes scan flip-flops both at an input side and an output side.

6. The semiconductor integrated circuit of claim 5, wherein both the scan flip-flops set in each input side of the delay test circuits and the scan flip-flops set in each output side of the delay test circuits are serially connected to constitute scan passes, respectively, and the test control unit sends test data for the delay test to the delay test circuit and receives output data from the delay test circuit through the scan pass.

7. The semiconductor integrated circuit of claim 3, wherein the delay test is configured to execute after the semiconductor integrated circuit is mounted in equipment.

8. The semiconductor integrated circuit of claim 7, wherein the memory unit includes a fuse ROM, the delay test is configured to execute when a shipment test is performed, and the power-supply voltage of the operation mode is written in the fuse ROM.

9. The semiconductor integrated circuit of claim 7, wherein the memory unit reads out the power-supply voltage of the operation mode from the fuse ROM and the delay test is executed after the semiconductor integrated circuit is mounted in equipment.

10. The semiconductor integrated circuit of claim 4, wherein
the delay circuit is a variable delay circuit in which the delay period is configured to be shifted in stepwise fashion, the test control unit executes the delay test while shifting the delay period of the variable delay circuit, and output data of the delay test circuit outputted through the scan pass are outputted to an external terminal.

11. The semiconductor integrated circuit of claim 10, wherein
the variable delay circuit includes a plurality of unit variable delay circuits and a selector.

12. The semiconductor integrated circuit of claim 10, wherein
the unit variable delay circuits are serially connected and an output of each of the unit variable delay circuits is connected to an input of the selector.

* * * * *